(12) United States Patent
Kozaka et al.

(10) Patent No.: US 7,800,209 B2
(45) Date of Patent: Sep. 21, 2010

(54) WIRING BOARD WITH CONDUCTIVE WIRINGS AND PROTRUSION ELECTRODES

(75) Inventors: Yukihiro Kozaka, Kyoto (JP); Nozomi Shimoishizaka, Kyoto (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 561 days.

(21) Appl. No.: 11/620,883

(22) Filed: Jan. 8, 2007

(65) Prior Publication Data
US 2007/0182009 A1    Aug. 9, 2007

(30) Foreign Application Priority Data
Feb. 9, 2006  (JP) .............................. 2006-032738

(51) Int. Cl.
*H01L 23/48* (2006.01)
*H01L 23/488* (2006.01)
*H01L 21/44* (2006.01)
*H05K 3/18* (2006.01)
*H05K 3/06* (2006.01)

(52) U.S. Cl. .......... 257/682; 257/E23.02; 257/E23.068; 257/E23.065; 257/E21.503; 257/737; 257/775; 257/773; 257/E21.174; 257/781; 257/776; 257/E23.021; 257/E23.023; 438/613; 174/534; 174/557; 174/558; 174/260; 174/261; 361/767

(58) Field of Classification Search ................ 257/737, 257/E23.02, E21.503, E23.065, E23.068, 257/775, 776, 772, 781, E23.021, E21.174, 257/E21.508, E23.023; 438/613; 174/534, 174/557, 558, 260; 361/767
See application file for complete search history.

(56) References Cited

U.S. PATENT DOCUMENTS

| | | | | |
|---|---|---|---|---|
| 5,260,518 A | * | 11/1993 | Tanaka et al. | ................ 174/261 |
| 5,317,801 A | * | 6/1994 | Tanaka et al. | ................. 29/830 |
| 5,493,074 A | * | 2/1996 | Murata et al. | ................ 174/254 |
| 6,548,327 B2 | * | 4/2003 | De Pauw et al. | ............. 438/118 |
| 6,831,543 B2 | * | 12/2004 | Mizoguchi et al. | ........... 336/200 |

(Continued)

FOREIGN PATENT DOCUMENTS

JP    2004-327936    11/2004

(Continued)

*Primary Examiner*—Alexander O Williams
(74) *Attorney, Agent, or Firm*—Hamre, Schumann, Mueller & Larson, P.C.

(57) ABSTRACT

A wiring board includes a film base, a plurality of conductive wirings aligned on the film base, and protrusion electrodes formed of a plated metal in the vicinity of end portions of the conductive wirings, respectively. An outer surface at both side portions of the protrusion electrodes in cross section in a width direction of the conductive wirings defines a curve, and the protrusion electrodes in cross section in a longitudinal direction of the conductive wirings define a rectangular shape. The conductive wirings include a first conductive wiring having a wiring width of W1 and a second conductive wiring having a wiring width of W2 larger than W1, and the protrusion electrode on the first conductive wiring and the protrusion electrode on the second conductive wiring have a substantially same height. The wiring board is capable of supporting conductive wirings with a practically enough strength to withstand a stress applied during the connection between the protrusion electrodes of the film base and electrode pads of a semiconductor element, providing sufficient connection stability and coping with a narrow pitch of the semiconductor element.

8 Claims, 13 Drawing Sheets

U.S. PATENT DOCUMENTS

| | | | |
|---|---|---|---|
| 7,288,729 B2 * | 10/2007 | Imamura et al. | 174/534 |
| 7,514,779 B2 * | 4/2009 | Hirose et al. | 257/700 |
| 2004/0212969 A1 | 10/2004 | Imamura et al. | |
| 2006/0268530 A1 * | 11/2006 | Nagao et al. | 361/749 |
| 2008/0236872 A1 * | 10/2008 | Kataoka et al. | 174/254 |

FOREIGN PATENT DOCUMENTS

JP    2009-253147 A  * 10/2009

* cited by examiner (a1)

(a2)

(b1)

(b2)

(c1)

(c2)

(d1)

(d2)

WIRING BOARD WITH CONDUCTIVE WIRINGS AND PROTRUSION ELECTRODES

BACKGROUND OF THE INVENTION

1. Field of the Invention

The present invention relates to a wiring board such as a tape carrier substrate used for a chip-on-film (COF) and a method for manufacturing the same, and also relates to a semiconductor device using such a wiring board and a method for manufacturing the same. More particularly, the present invention relates to an improved protrusion electrode formed on a conductive wiring of a wiring board.

2. Description of Related Art

As one type of package modules using a film base, a COF has been known. FIG. 11 is a partial cross-sectional view showing a conventional COF. This COF includes a semiconductor element 2 mounted on a flexible insulating tape carrier substrate 1, which is protected by an encapsulation resin 3. The COF mainly is used as a driver for driving a flat panel display.

The tape carrier substrate 1 includes an insulating film base 4 made of polyimide or the like on which a plurality of conductive wirings 5 made of copper or the like are aligned. These conductive wirings 5 are connected with electrode pads 6 on the semiconductor element 2 via protrusion electrodes 7. A metal plated coating 8 and a solder resist layer 9 made of an insulating resin are formed on the conductive wirings 5 if necessary.

The protrusion electrodes 7 are formed with respect to the conductive wirings 5 on the tape carrier substrate 1 or the electrode pads 6 on the semiconductor element 2. In a wiring board described in JP 2004-327936 A, a protrusion electrode 7 is formed by metal plating conducted with respect to a conductive wiring 5 on a film base 4 as shown in FIG. 12A and FIG. 12B. FIG. 12A is a plan view, and FIG. 12B is a cross-sectional view taken along with the line F-F of FIG. 12A. This protrusion electrode 7 traverses the conductive wiring 5 and extends over both sides of the conductive wiring 5, that is, is bonded to the top face and the both side faces of the conductive wiring 5. Therefore, the relationship of "width S1 of the protrusion electrode 7">"wiring width S2 of the conductive wiring 5" is established. This configuration ensures the sufficient stability of the protrusion electrode 7 against a force applied in the horizontal direction. Furthermore, as shown in FIG. 12B, this protrusion electrode 7 is in a convex sectional shape with a center portion higher than both end portions. Thereby, even when the protrusion electrode 7 is misaligned with respect to the electrode pad 6 on the semiconductor element 2, the possibility of the connection with an inappropriate electrode pad 6 can be reduced.

FIG. 13A is a plan view of a semiconductor device described in JP 2004-327936 A. FIG. 13A is a rear side view of the tape carrier substrate 1, where the film base 4 is illustrated with dashed lines and the remaining elements are illustrated with solid lines for the sake of clarity. FIG. 13B is a cross-sectional view taken along the line G-G of FIG. 13A.

When mounting the semiconductor element 2 to the tape carrier substrate 1 with a plurality of conductive wirings 5 aligned thereon as described above, there is a problem of a break 5x occurring in a conductive wiring 5 because of a stress applied to the conductive wiring 5 close to a protrusion electrode 7 due to a load or ultrasonic waves applied thereto.

Such a break will be a very serious problem because there is a demand to narrow a width of the conductive wiring 5 along with the need to narrow the pitch of the electrode pads 6 of the semiconductor element 2 resulting from a trend toward an increasing number of outputs of a COF, and thus there is a tendency to degrade the strength of the conductive wiring 5.

Especially in the case of the arrangement of the conductive wirings 5 as shown in FIG. 14, there is an increasing tendency toward a break due to the stress concentration. FIG. 14 is a front side view of the tape carrier substrate 1, in which unlike FIG. 13A a region 2a where the semiconductor element is to be mounted is illustrated with dashed lines.

Among a plurality of conductive wirings $5a$ to $5d$ aligned on the film base 4, the conductive wirings $5a$ are arranged with other conductive wirings ($5a$ or $5b$) adjacent thereto on both sides. On the other hand, the conductive wirings $5b$ located at both ends in a longitudinal direction of the semiconductor element mounting region $2a$, the conductive wirings $5c$ located on the short sides and the conductive wirings $5d$ located in isolation do not have other conductive wirings adjacent thereto on at least one of both sides.

Such conductive wirings $5b$ to $5d$ without other conductive wirings adjacent thereto on one of both sides have an increasing tendency toward a break due to the stress concentration as compared with the conductive wirings $5a$ having other conductive wirings adjacent thereto on both sides.

SUMMARY OF THE INVENTION

Therefore, with the foregoing in mind, it is an object of the present invention to provide a wiring board capable of supporting conductive wirings with a practically sufficient strength to withstand a stress applied when protrusion electrodes of a film base are connected with electrode pads of a semiconductor element, providing sufficient connection stability and coping with a narrow pitch of the semiconductor element.

A wiring board of the present invention includes a film base, a plurality of conductive wirings aligned on the film base, and protrusion electrodes formed of a plated metal in the vicinity of end portions of the conductive wirings, respectively. In order to cope with the above-stated problems, an outer surface at both side portions of the protrusion electrodes in cross section in a width direction of the conductive wirings defines a curve, and the protrusion electrodes in cross section in a longitudinal direction of the conductive wirings define a rectangular shape. The conductive wirings include a first conductive wiring having a wiring width of W1 and a second conductive wiring having a wiring width of W2 larger than W1. The protrusion electrode on the first conductive wiring and the protrusion electrode on the second conductive wiring have substantially the same height.

A method for manufacturing a wiring board of the present invention includes the steps of: using a film base on which a plurality of conductive wirings are aligned; forming a photoresist on a face of the film base on which the conductive wirings are provided, forming an aperture in a slot-shaped pattern traversing the aligned conductive wirings and including a region on both sides of the conductive wirings, so as to allow a part of the conductive wirings to be exposed in the slot-shaped pattern; and conducting metal plating with respect to the exposed part of the conductive wirings through the slot-shaped pattern of the photoresist to form protrusion electrodes. In order to cope with the above-stated problems, the film base used includes a first conductive wiring having a wiring width of W1 and a second conductive wiring having a wiring width of W2 larger than W1 as the conductive wirings provided thereon. The protrusion electrode formation step by the metal plating is conducted in such a manner that a relationship of heights of the protrusion electrodes formed by the metal plating with reference to widths of the conductive wirings changes through region A, region B and region C successively as the width of the conductive wirings increases, where in the region A the height of the protrusion electrodes increases with an increase in the width of the conductive wirings, in the region B the protrusion electrode higher than in the region A is formed and the height of the protrusion electrodes becomes a maximum, and in the region C the protrusion electrode lower than in the region B is formed and the height of the protrusion electrodes decreases. The wiring width W1 of the first conductive wiring is set within the region A and the wiring width W2 of the second conductive wiring is set within the region C.

These and other advantages of the present invention will become apparent to those skilled in the art upon reading and understanding the following detailed description with reference to the accompanying figures.

DETAILED DESCRIPTION OF THE INVENTION

Figure 1A:
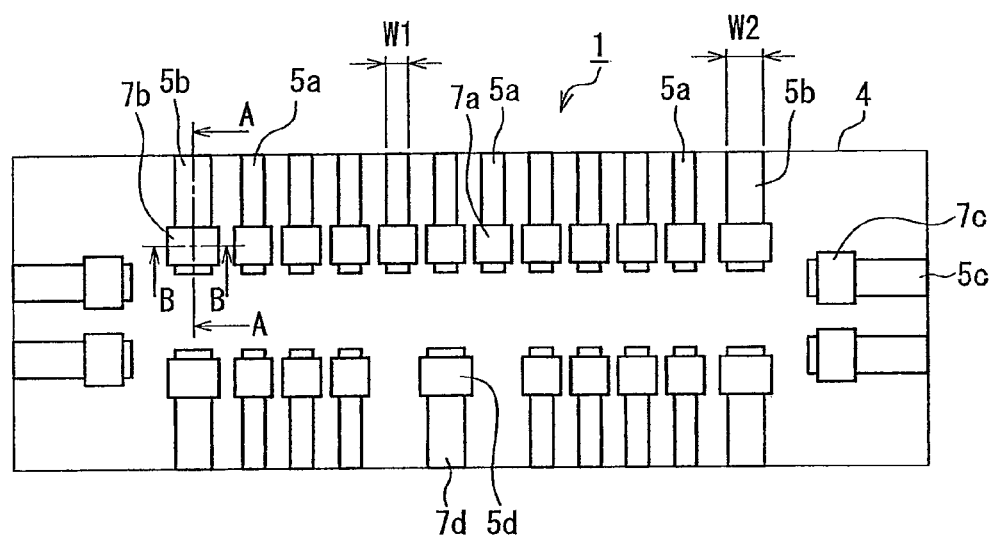
FIG. 1A is a partial plan view of a tape carrier substrate according to one embodiment of the present invention.

In the wiring board of the present invention, an outer surface at both side portions of the protrusion electrodes formed at end portions of the conductive wirings on the film base by metal plating defines a curve in cross section in a width direction of the conductive wirings, and the protrusion electrodes in cross section in a longitudinal direction of the conductive wirings define a rectangular shape. The conductive wirings include a first conductive wiring having a wiring width of W1 and a second conductive wiring having a wiring width of W2 larger than W1. The protrusion electrode on the first conductive wiring and the protrusion electrode on the second conductive wiring have substantially the same height.

With the wiring board having the above-stated configuration, a wider conductive wiring is provided at a position where a break is likely to occur at a portion close to a protrusion electrode when a semiconductor element is mounted thereon. Thereby, it can withstand a stress resulting from a load and ultrasonic waves applied for mounting the semiconductor element, and a break of such a conductive wiring in the vicinity of the protrusion electrode can be prevented. Furthermore, since the height of the protrusion electrode on a wider conductive wiring is similar to that of the protrusion electrode on a narrow conductive wiring, favorable connection with electrode pads to be connected can be established. Moreover, since a wider conductive wiring is provided only at a position susceptible to a break, the narrower pitch of the pad can be accommodated.

In the wiring board having the above-stated configuration, preferably, the protrusion electrodes are formed by metal plating, and assuming that during a process of forming the protrusion electrodes by the metal plating, a maximum of heights of the protrusion electrodes that change in accordance with a change in widths of the conductive wirings is hB, a height of the protrusion electrode formed on the first conductive wiring is h1 and a height of the protrusion electrode formed on the second conductive wiring is h2, the wiring width W1 and the wiring width W2 are set so that a difference between the heights of the protrusion electrodes establishes the following relationships:

$$|h1-h2|<(hB-h1) \text{ and } |h1-h2|<(hB-h2).$$

Preferably, the second conductive wiring is disposed at least one of an end position of a line of the conductive wirings and an isolated position. Herein, the isolated position refers to a position at a considerably long distance from an adjacent other conductive wiring as compared with the pitch of the arrangement of a plurality of conductive wirings, thus causing a greater stress applied thereto during mounting than a stress applied to one of the conductive wirings in the arrangement.

Preferably, a curvature radius of an outer surface at both side portions of the protrusion electrodes in cross section in the width direction of the conductive wirings is larger in the protrusion electrode on the second conductive wiring than in the protrusion electrode on the first conductive wiring.

In the method for manufacturing a wiring board of the present invention, when the protrusion electrodes are formed on the conductive wirings of the film base, a pattern having a slot-shaped aperture traversing the aligned conductive wirings is formed, and the protrusion electrodes are formed by metal plating conducted with respect to the exposed part of the conductive wirings in the slot-shaped aperture. The film base used includes a first conductive wiring having a wiring width of W1 and a second conductive wiring having a wiring width of W2 larger than W1 as the conductive wirings provided thereon. The protrusion electrode formation step by the metal plating is conducted in such a manner that a relationship of heights of the protrusion electrodes formed by the metal plating with reference to widths of the conductive wirings changes through region A, region B and region C successively as the width of the conductive wirings increases, where in the region A the height of the protrusion electrodes increases with an increase in the width of the conductive wirings, in the region B the protrusion electrode higher than in the region A is formed and the height of the protrusion electrodes becomes a maximum, and in the region C the protrusion electrode lower than in the region B is formed and the height of the protrusion electrodes decreases. The wiring width W1 of the first conductive wiring is set within the region A and the wiring width W2 of the second conductive wiring is set within the region C.

As the width of a wiring increases, a current density increases but an ion concentration decreases around the conductive wiring because the reaction of the electrolytic plating proceeds, and therefore the growth of plating is inhibited. The above-stated method for manufacturing a wiring board makes use of such a phenomenon, and facilitates the formation of protrusion electrodes having a similar height on conductive wirings having different wiring widths.

In the above-stated method for manufacturing a wiring board, assuming that a height of the protrusion electrode formed on the first conductive wiring is h1, a height of the protrusion electrode formed on the second conductive wiring is h2 and a height of the protrusion electrode formed on a conductive wiring having a width within the region B is hB, the wiring widths W1 and W2 preferably are set so that a difference between the heights of the protrusion electrodes establishes the following relationships:

$$|h1-h2|<(hB-h1) \text{ and } |h1-h2|<(hB-h2).$$

Preferably, the wiring widths W1 and W2 are set so that the heights of the protrusion electrodes h1 and h2 are equal.

The conductive wiring width W1 in the region A may be 13 to 17 μm, the conductive wiring width WB in the region B may be 18 to 22 μm, and the conductive wiring width W2 in the region C may be 23 to 27 μm.

A semiconductor device of the present invention includes the wiring board having any one of the above-stated configurations and a semiconductor element mounted on the wiring board. Electrode pads of the semiconductor element and the conductive wirings are connected via the protrusion electrodes.

A method for manufacturing a semiconductor device of the present invention includes the steps of: using the wiring board having any one of the above-stated configurations, forming an encapsulation resin over a region where the protrusion electrodes are formed on the conductive wirings, then disposing a semiconductor element above the wiring board so that electrode pads of the semiconductor element are opposed to the protrusion electrodes and connecting the electrode pads of the semiconductor element with the conductive wirings via bonding with the protrusion electrodes.

In this manufacturing method, preferably, when the electrode pads of the semiconductor element are connected with the protrusion electrodes, while the electrodes pads and the protrusion electrodes are brought into contact with each other and a pressure is applied thereto, ultrasonic waves are applied to a portion of the contact.

The following describes embodiments of the present invention more specifically, with reference to the drawings.

Figure 1B:
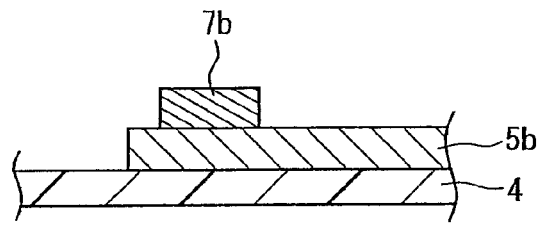
FIG. 1B is a cross-sectional view taken along the line A-A of FIG. 1A
Figure 1C:
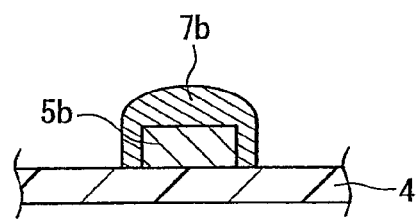
FIG. 1C is a cross-sectional view taken along the line B-B of FIG. 1A.
Figure 2:
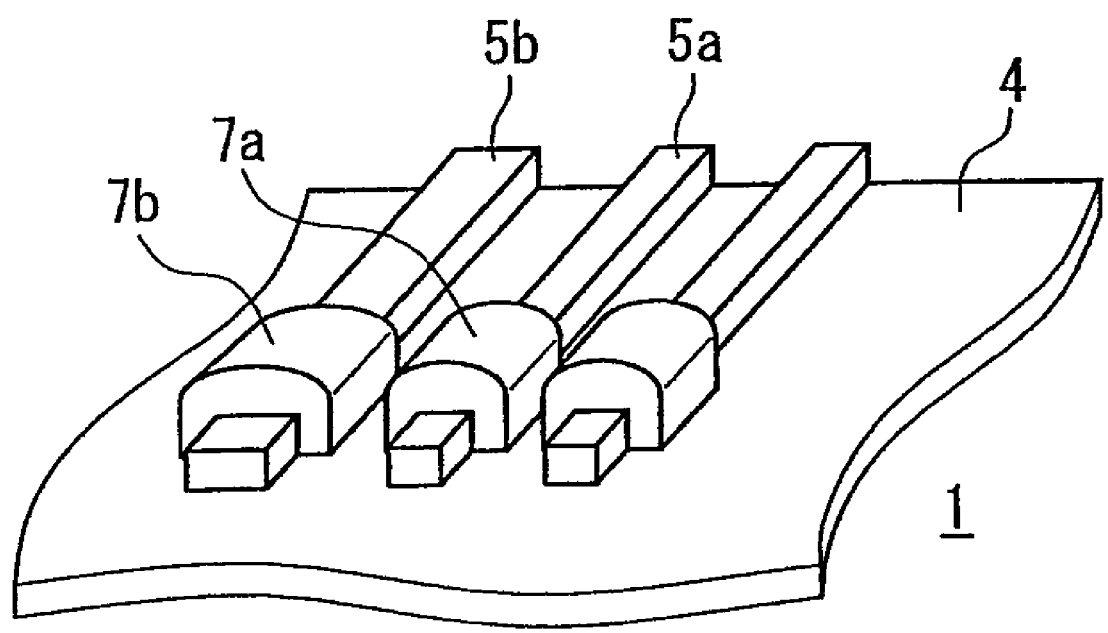
FIG. 2 is a partial perspective view of the tape carrier substrate.

FIG. 1A is a partial plan view of a wiring board of one embodiment of the present invention, FIG. 1B is a cross-sectional view taken along the line A-A of FIG. 1A and FIG. 1C is a cross-sectional view taken along the line B-B of FIG. 1A. FIG. 2 is a partial perspective view of the wiring board.

In FIGS. 1 and 2, the tape carrier substrate 1 includes an insulating film base 4, a plurality of conductive wirings 5a, 5b, 5c and 5d aligned on the film base 4 and protrusion electrodes 7a, 7b, 7c and 7d respectively formed on the conductive wirings 5a to 5d. As illustrated in FIG. 1C or FIG. 2, an outer surface of the protrusion electrodes 7a to 7d in cross section in the width direction of the conductive wirings 5a to 5d defines a curve at both side portions. Whereas, as illustrated in FIG. 1B, the protrusion electrodes 7a to 7d in cross section in the longitudinal direction of the conductive wirings 5a to 5d define a rectangular shape. In the following description, the conductive wirings 5a to 5b may be referred to as conductive wirings 5 collectively, and the protrusion electrodes 7a to 7d may be referred to as protrusion electrodes 7 collectively.

A feature of the tape carrier substrate 1 of the present embodiment resides in that a width W2 of the conductive wirings 5b to 5d disposed at positions susceptible to the influences of a stress due to a load or ultrasonic waves applied for mounting a semiconductor element is larger than a width W1 of the conductive wirings 5a disposed at normal positions having other conductive wirings adjacent thereto on both sides. That is to say, conductive wirings that are disposed at positions susceptible to stress concentration, including the conductive wirings 5b located at both ends in a longitudinal direction of a semiconductor element mounting region, the conductive wirings 5c located on the short sides and the conductive wirings 5d located in isolation, have a larger width W2. This can suppress a break in the conductive wirings 5b to 5d in the vicinity of the protrusion electrodes 7b to 7d.

Furthermore, the protrusion electrodes 7b to 7d on the conductive wirings 5b to 5d having a width different from that of the conductive wirings 5a are formed to have a height similar to that of the protrusion electrodes 7a. As described later, the protrusion electrodes 7a to 7d are formed on the conductive wirings 5a to 5d by metal plating. Metal plating is a process of isotropic growth on a surface of the conductive wirings, and therefore the height of the protrusion electrodes tends to increase in proportion to the width of the conductive wirings. If the height varies among the protrusion electrodes, there is a risk of poor connection occurring when a semiconductor element is mounted. More specifically, when the semiconductor element is mounted, it is difficult to apply a sufficient load and ultrasonic waves to a low protrusion electrode adjacent to a high protrusion electrode. Therefore, there is a risk of a low protrusion electrode not reaching the electrode pad of the semiconductor element or a risk of instable connection.

Then, in order to stabilize the connection between the protrusion electrodes 7a on the narrow conductive wirings 5a and electrode pads of the semiconductor element, in the present embodiment, the protrusion electrodes 7b to 7d on the wide conductive wirings 5b to 5d and the protrusion electrodes 7a on the narrow conductive wirings 5a are adjusted to have a similar height as shown in FIG. 2. Thus, the curvature radius of an outer surface at both side portions of the protrusion electrodes in cross section in the width direction of the conductive wirings is larger in the protrusion electrodes 7b to 7d on the wide conductive wirings 5b to 5d than in the protrusion electrodes 7a on the narrow conductive wirings 5a. A method for forming protrusion electrodes having a similar height on conductive wirings having different widths will be described later.

Figure 3:
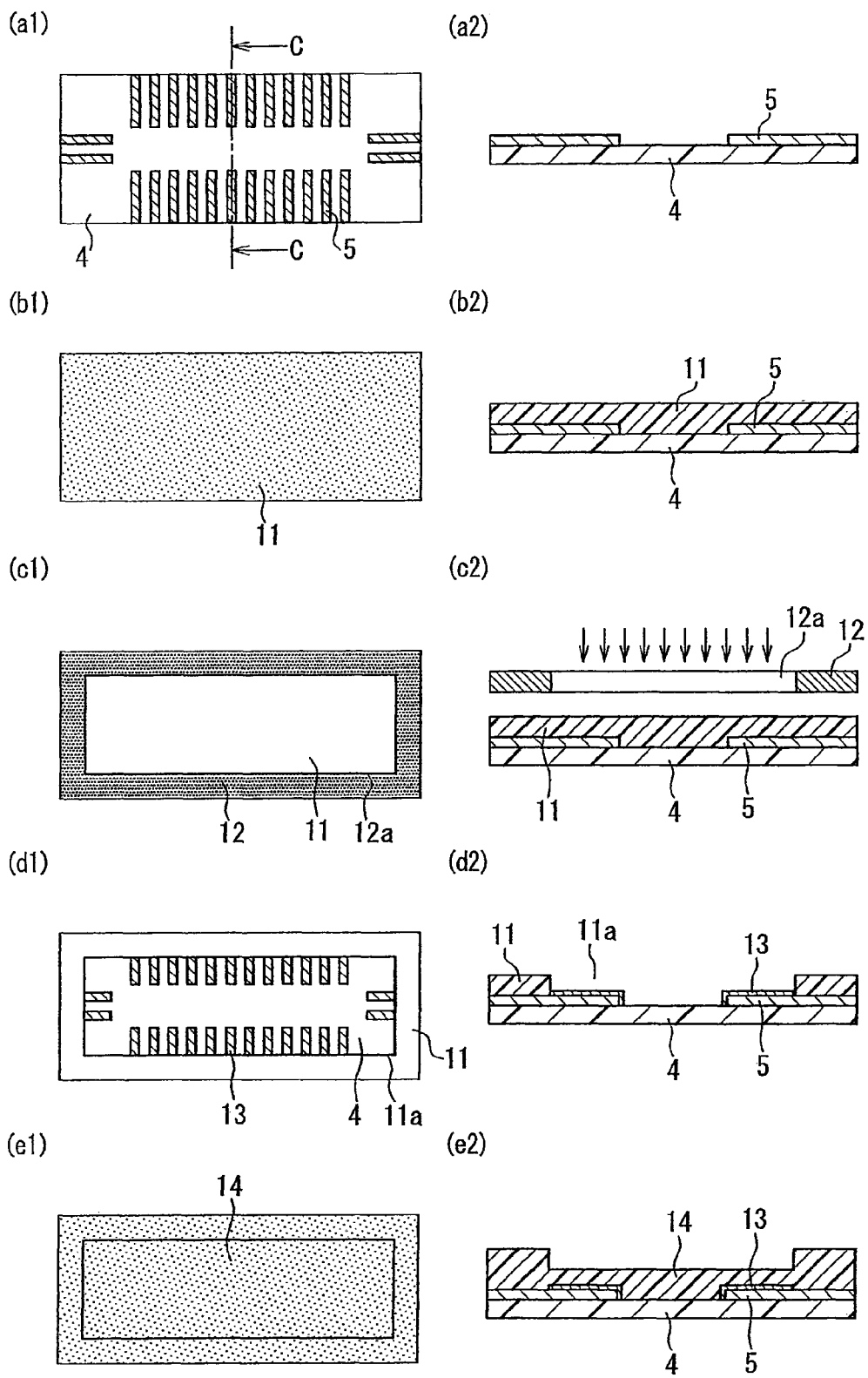
FIG. 3 shows the first half process of a manufacturing process of the tape carrier substrate.
Figure 4:
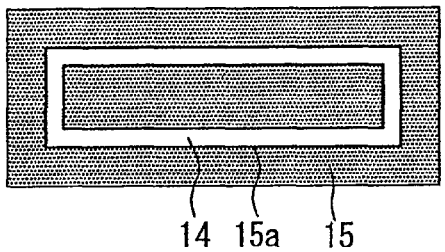
FIG. 4 shows the last half process of the manufacturing process of the tape carrier substrate.
Figure 4:
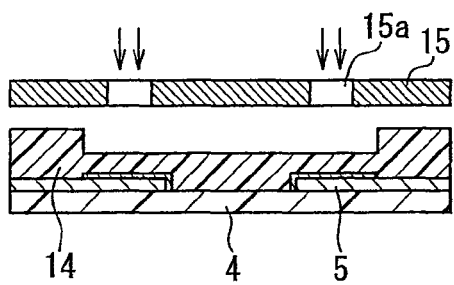
Figure 4:
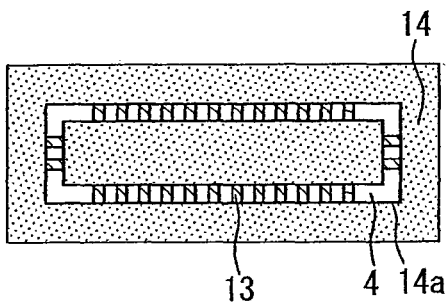
Figure 4:
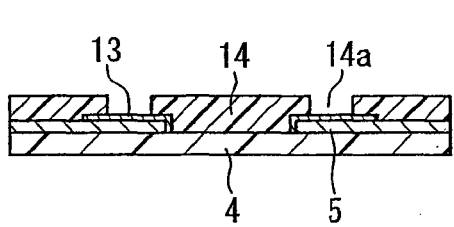
Figure 4:
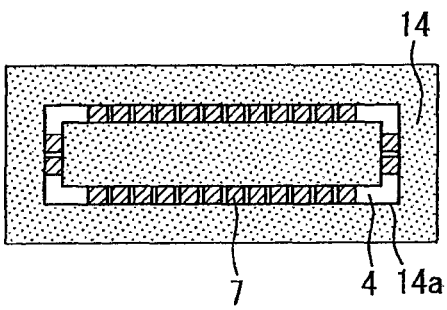
Figure 4:
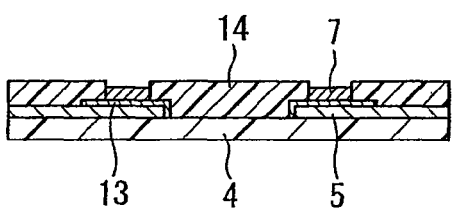
Figure 4:
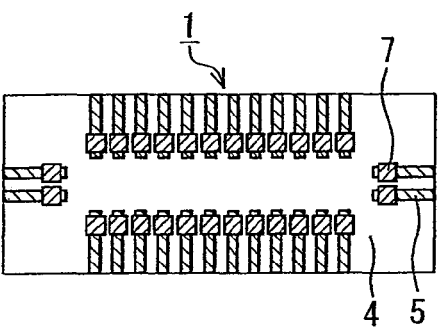
Figure 4:
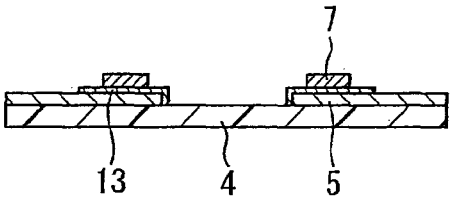

The following describes a method for manufacturing the tape carrier substrate 1 according to the present embodiment of the present invention. FIG. 3 and FIG. 4 show the manufacturing process of the tape carrier substrate, where FIG. 3 shows the first half process and FIG. 4 shows the last half process. The drawings on the left side are plan views of a semiconductor element mounting portion of the tape carrier substrate, and the right side is an enlarged cross-sectional view of the corresponding semiconductor element mounting portion on the left side, showing a cross section taken along the line C-C of FIG. 3($a$1).

Firstly, as shown in FIGS. 3($a$1) and ($a$2), a film base 4 on a surface of which a plurality of conductive wirings 5 are aligned is prepared. In this example, a plurality of conductive wirings 5 are arranged along each of the four sides of a rectangular film base 4, and the conductive wirings 5 extend in the direction perpendicular to the corresponding edge of the film base 4. Although the conductive wirings 5 having different widths should be formed as shown in FIG. 1, they are shown with the same width for convenience of illustration.

A photoresist 11 is formed all over this film base 4 as shown in FIGS. 3($b$1) and ($b$2). Next, as shown in FIGS. 3($c$1) and ($c$2), an exposure mask 12 for the plating to a region where electrodes for the plurality of conductive wirings 5 are to be formed is opposed above the photoresist 11 on the film base 4, and the photoresist 11 is exposed to light via a light transmission region 12$a$ of the exposure mask 12. The light transmission region 12$a$ is set so as to traverse the plurality of conductive wirings 5 along the direction where the plurality of conductive wirings 5 are aligned and to include a region wider than a predetermined electrode formation region for each of the plurality of conductive wirings 5 in the wiring width direction as well as the wiring length direction. In the illustrated example, the light transmission region 12$a$ is set in a rectangular aperture shape corresponding to a central portion of the film base 4.

Thereafter, development is conducted thereto, whereby an aperture 11$a$ corresponding to the light transmission region 12$a$ is formed in the photoresist 11 as shown in FIGS. 3($d$1) and ($d$2) to expose a part of each of the conductive wirings 5. Next, metal plating is conducted for the exposed portions of the conductive wirings 5 through the aperture 11$a$ to form a hard metal film 13. Next, as shown in FIGS. 3($e$1) and ($e$2), a photoresist 14 is formed again all over the film base 4.

Next, as shown in FIGS. 4($a$1) and ($a$2), an exposure mask 15 for the formation of protrusion electrodes 7 is opposed above the photoresist 14 on the film base 4, and the photoresist 14 is exposed to light via a light transmission region 15$a$ of the exposure mask 15. The light transmission region 15$a$ is a rectangular frame shape including the combination of slots that extend and traverse the plurality of conductive wirings 5 (and the hard metal film 13) along the direction where the plurality of conductive wirings 5 are aligned.

Thereafter, development is conducted thereto, whereby an aperture 14$a$ in a rectangular frame shape corresponding to the light transmission region 15$a$ is formed in the photoresist 14 as shown in FIGS. 4($b$1) and ($b$2) to expose a part of the hard metal film 13 on each of the conductive wirings 5. Next, metal plating is conducted for the exposed portions of the hard metal film 13 on the conductive wirings 5 through the aperture 14$a$ in a rectangular frame shape, whereby the protrusion electrodes 7 are formed as shown in FIGS. 4($c$1) and ($c$2).

Finally, the photoresist 14 is removed, whereby a tape carrier substrate 1 including the conductive wirings 5 on which the protrusion electrodes 7 are formed via the hard metal film 13 can be obtained as shown in FIGS. 4($d$1) and ($d$2).

Note here that, although not illustrated concerning the above-stated method, the widths of the conductive wirings 5 are set in a manner described later depending on the particular positions. According to the above-stated method, metal plating is conducted through the aperture 14$a$ including the combination of slots that traverse the plurality of conductive wirings 5 in the process of FIGS. 4($c$1) and ($c$2). Thus, the protrusion electrodes 7 can be formed in a shape as illustrated in FIGS. 1A to 1C and FIG. 2. This is because metal plating is formed all over the exposed faces of the conductive wirings 5, i.e., not only over the top faces but also over the side faces. During this process, the metal plating can grow over the top faces as well as the side faces of the conductive wirings 5, so that the metal plating in a constant shape and size can be formed even when the aperture 14$a$ is misaligned in the width direction of the conductive wirings 5, and the design condition can be satisfied. This means that strict accuracy is not required for the alignment of the exposure mask 15 for forming the aperture 14$a$, and therefore the adjustment is easy.

Also, even in the case where the aperture 14$a$ is misaligned in the length direction of the conductive wirings 5, the protrusion electrodes 7 are never displaced from the hard metal film 13. This is because the aperture 14$a$ is formed through the above-stated light transmission region 15$a$ so as to allow the hard metal film 13 to be exposed in a region wider than the electrode formation region in the wiring length direction.

As one example of the metal plating of copper for forming the protrusion electrodes 7, copper sulfate may be used as a plating solution, and electrolytic plating may be conducted under the condition of 0.3 to 5 A/dm$^2$. Electrolytic plating is a suitable method for forming the protrusion electrode 7 having a cross section as illustrated in FIG. 1C and having a sufficient thickness.

The following describes a method for equalizing the height of the protrusion electrodes 7$a$ with that of the protrusion electrodes 7$b$ to 7$d$ as shown in FIGS. 1 and 2.

As stated above, when the protrusion electrodes 7 are formed on the conductive wirings 5 of the tape carrier substrate 1 by metal plating, plating grows in an isotropic manner on the surface of the conductive wirings 5. Therefore, the height of the protrusion electrodes 7 will increase in proportion to the width of the conductive wirings 5. If a current and a time for plating are constant, the height of a protrusion electrode 7, made of copper by electrolytic plating, will be determined in accordance with a cross-sectional area of the conductive wiring 5. In the present case, since the thickness of the conductive wiring 5 is constant, i.e., the thickness of a seed layer, a different width of the conductive wiring 5 means a different cross-sectional area of the conductive wiring 5. Thus, as a current density changes, the height of the protrusion electrode 7 changes as well.

Figure 5A:
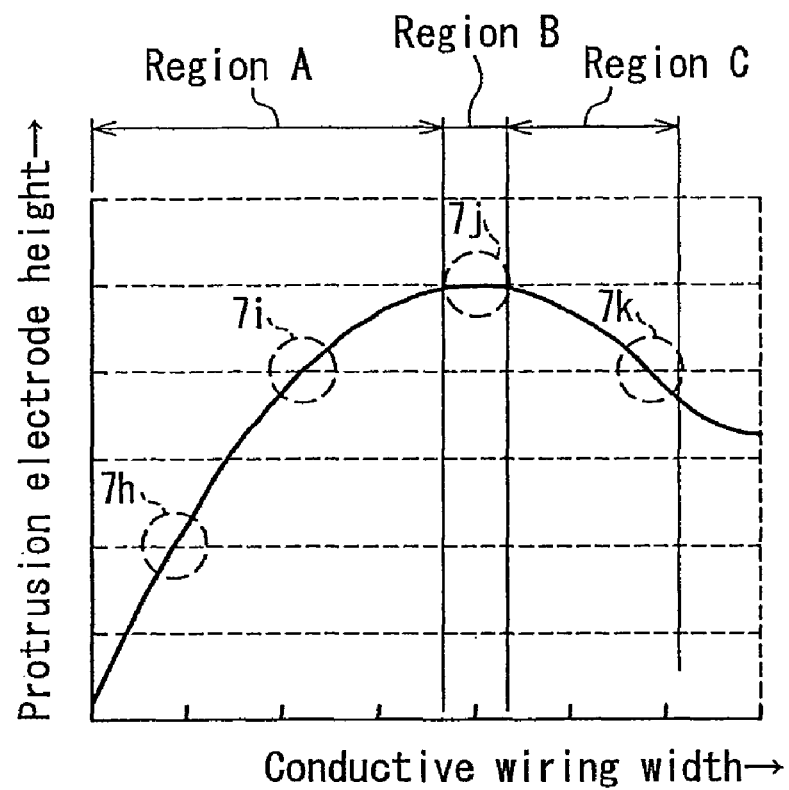
FIG. 5A schematically shows the relationship between the width of conductive wirings and the height of protrusion electrodes formed by the above manufacturing method.
Figure 5B:
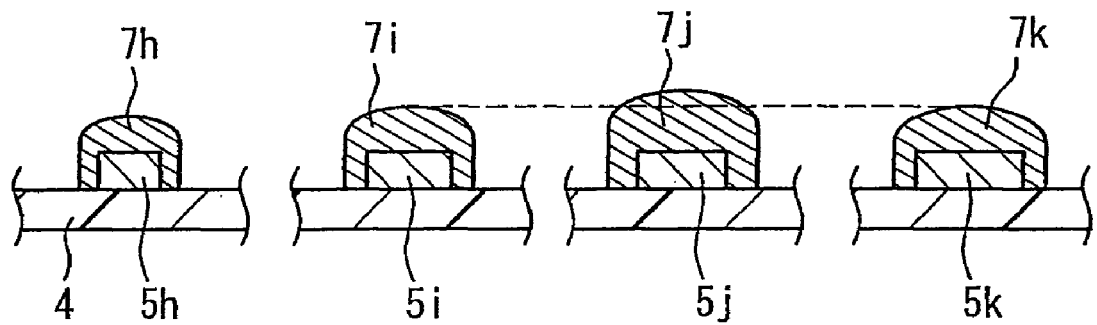
FIG. 5B is a cross-sectional view showing the heights of the protrusion electrodes formed by metal plating conducted with respect to conductive wirings having different widths.

FIG. 5A schematically shows the relationship between the width of conductive wirings and the height of protrusion electrodes when the protrusion electrodes are formed on the conductive wirings having different widths by metal plating. FIG. 5B is a cross-sectional view showing the heights of the protrusion electrodes 7$h$, 7$i$, 7$j$ and 7$k$ formed on conductive wirings 5$h$, 5$i$, 5$j$ and 5$k$ having different widths by metal plating. The heights of the protrusion electrodes 7$h$ to 7$k$ of FIG. 5B are illustrated with the same reference numerals in FIG. 5A. In the region A of FIG. 5A, as the width of the conductive wiring 5 increases, a current density increases gradually, and therefore the height of a protrusion electrode 7 increases as well (7h, 7i). In the region B, the protrusion electrode 7 becomes the highest (7j). Then, as the width of the conductive wiring 5 further increases in the region C, the height of the protrusion electrode 7 decreases inversely (7k). This is because although the current density increases with an increase in the width of the conductive wiring 5, as the reaction of the electrolytic plating proceeds, the copper ion concentration decreases around the conductive wiring 5, thus inhibiting the growth of plating.

Figure 6A:
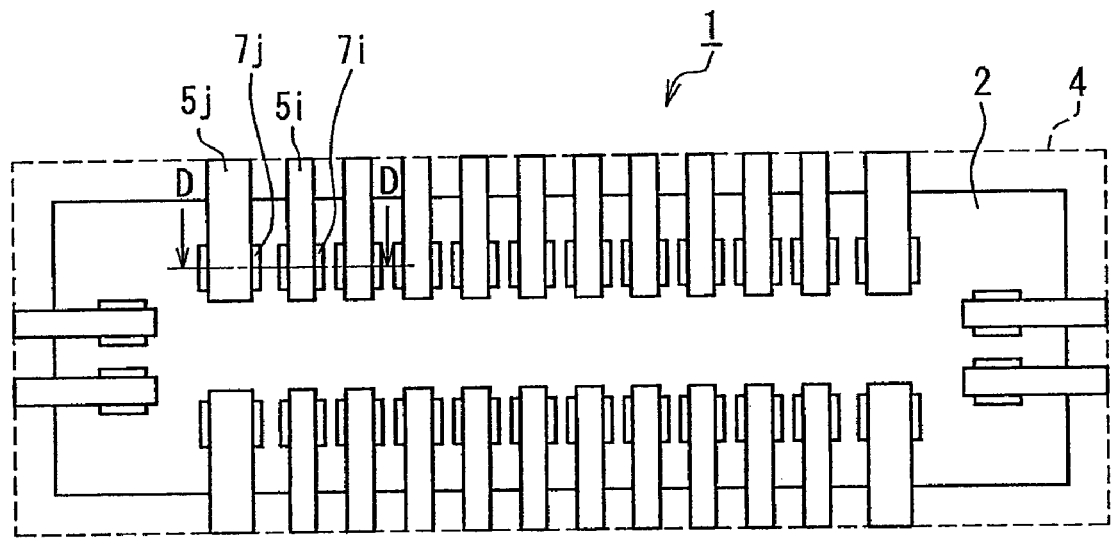
FIG. 6A is a plan view of a semiconductor device employing a tape carrier substrate as a disadvantageous example formed by the above manufacturing method.
Figure 6B:
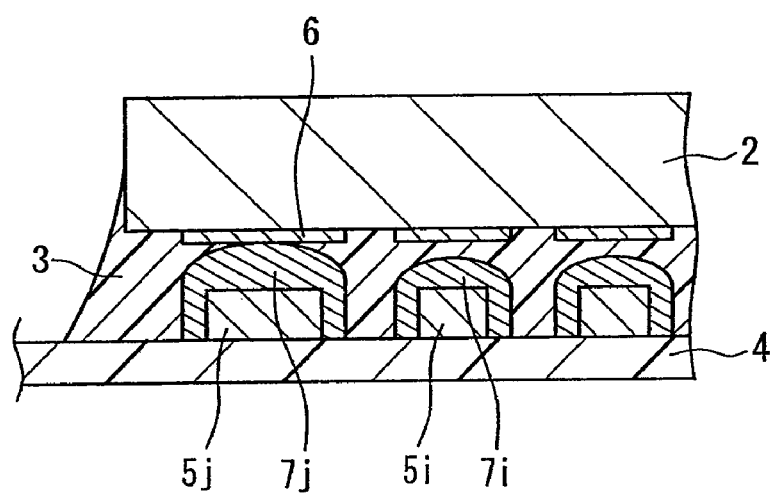
FIG. 6B is a cross-sectional view taken along the line D-D of FIG. 6A.

FIG. 6A is a plan view of a semiconductor device where conductive wirings 5j located at both ends in the longitudinal direction of a semiconductor element 2 are formed wider than other conductive wirings 5i. FIG. 6B is a cross-sectional view taken along the line D-D of FIG. 6A. This example corresponds to the case where the widths of the conductive wirings 5i and 5j are selected from the region A and the region B, respectively, of FIG. 5A. The protrusion electrode 7j on the conductive wiring 5j is higher than the protrusion electrode 7i on the conductive wiring 5i.

Therefore, when a load and ultrasonic waves are applied thereto in order to connect the protrusion electrodes with the electrode pads, the low protrusion electrode 7i on the narrow conductive wiring 5i adjacent to the high protrusion electrode 7j on the wide conductive wiring 5j does not reach the electrode pad 6, and therefore connection cannot be established therebetween. Alternatively, even if the low protrusion electrode 7i can reach the electrode pad 6, a sufficient load and ultrasonic waves cannot be applied during the mounting, thus causing instable connection. To cope with this, if a load and an amplitude of the ultrasonic waves are increased to further deform the high protrusion electrode 7j, then the low protrusion electrode 7i can reach the electrode pad 6, and therefore a sufficient load and ultrasonic waves will be applied thereto. However, an excessive load will be applied to the wide conductive wiring 5j, which may cause a break in the conductive wiring 5j.

Figure 7A:
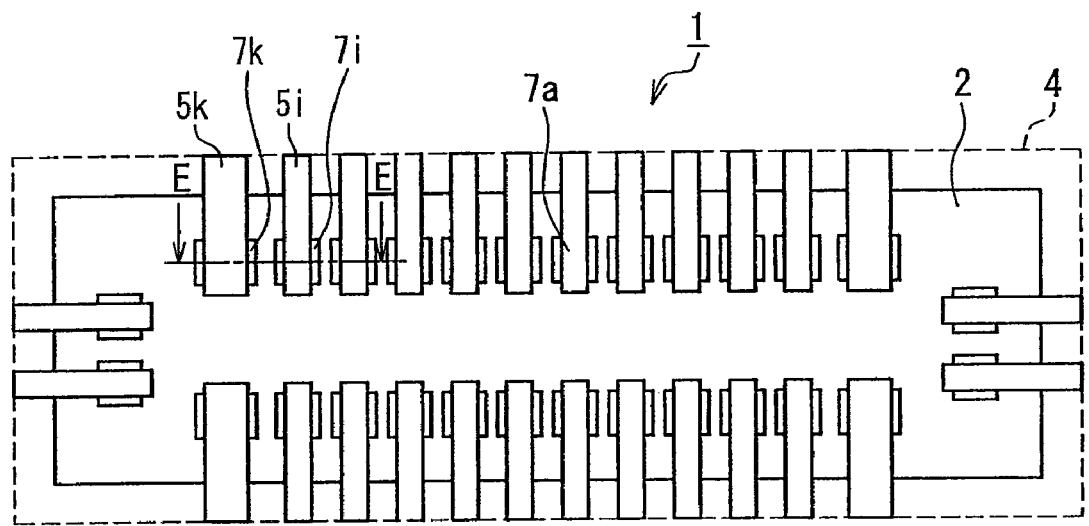
FIG. 7A is a plan view of a semiconductor device employing a tape carrier substrate as an advantageous example formed by the above manufacturing method.
Figure 7B:
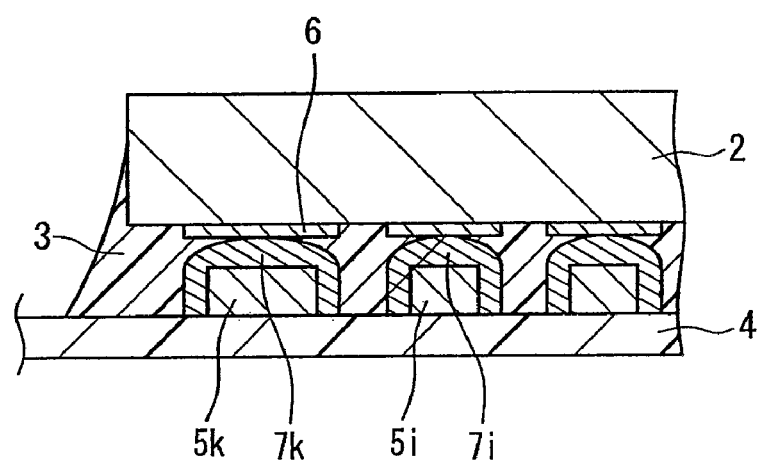
FIG. 7B is a cross-sectional view taken along the line E-E of FIG. 7A.

On the other hand, FIG. 7A is a plan view of a semiconductor device where conductive wirings 5k having a larger width selected from the region C of FIG. 5A are disposed at both ends in the longitudinal direction of the semiconductor element 2, and the width of the other conductive wirings 5i is selected from the region A. FIG. 7B is a cross-sectional view taken along the line E-E of FIG. 7A. In this example, the two different widths of the conductive wirings 5i and 5k are selected from the respective ranges of the region A and the region C of FIG. 5A, allowing the protrusion electrodes 7i and 7k formed thereon to have a similar height. Thereby, the narrow conductive wirings 5i and the wide conductive wirings 5k can be formed so as not to have different heights of the protrusion electrodes formed thereon.

Herein, assuming that the height of the protrusion electrodes 7i formed on the narrow conductive wirings 5i is h1, the height of the protrusion electrodes 7k formed on the wide conductive wirings 5k is h2 and the height of the protrusion electrode formed on the conductive wiring having a width within the region B is hB, it is desirable that the wiring widths W1 and W2 of the conductive wirings 5i and 5k be set so that a difference between the heights of the protrusion electrodes establishes the following relationships:

$|h1-h2|<(hB-h1)$ and $|h1-h2|<(hB-h2)$.

Figure 8:
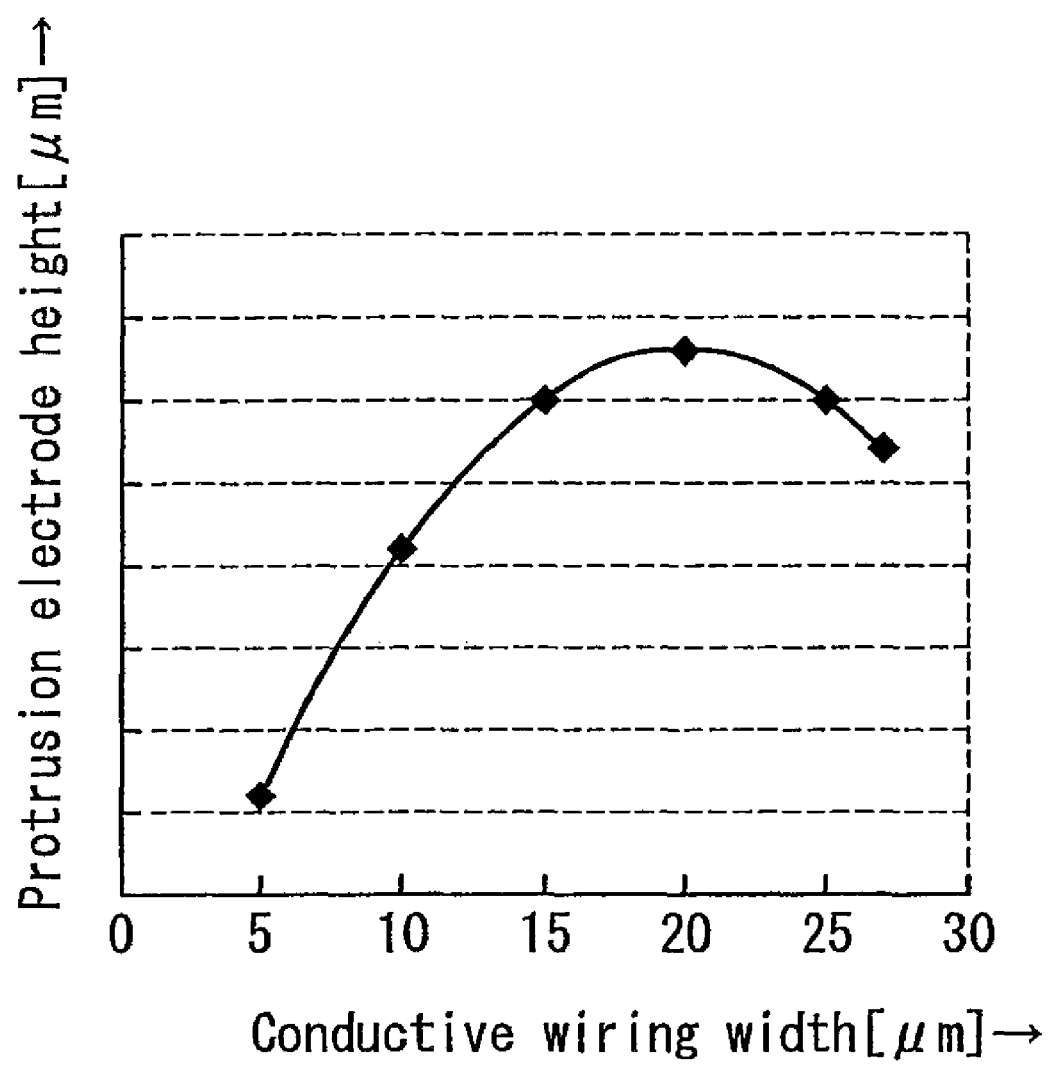
FIG. 8 shows a result of the experiment for verifying the relationship between the width of the conductive wirings and the height of the protrusion electrodes on the above-stated tape carrier substrate.

FIG. 8 shows the result of the experiment for verifying the relationship between the width of the conductive wirings and the height of the protrusion electrodes. The widths of the conductive wirings from 13 to 17 μm were selected as the region A of FIG. 5A, and the widths of the conductive wirings from 18 to 22 μm were selected as the region B, and the widths of the conductive wirings from 23 to 27 μm were selected as the region C, whereby the protrusion electrodes could have a substantially uniform height.

Figure 14:
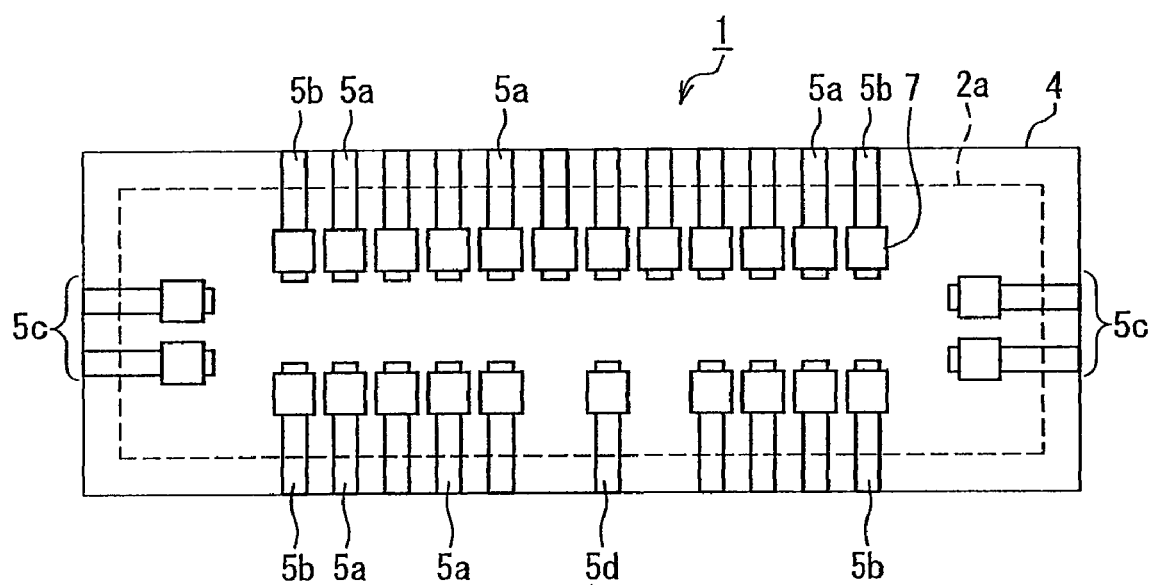
FIG. 14 is a plan view showing the positions susceptible to influences of a stress when a semiconductor element is mounted to a conventional tape carrier substrate.

In this way, a wide conductive wiring having a width within the region C is selected as the conductive wirings 5b located at both ends in a longitudinal direction of the semiconductor element mounting region 2a, 5c located on the short sides and 5d located in isolation as shown in FIG. 14, i.e., at positions susceptible to the stress concentration. With this configuration, a break of such a conductive wiring in the vicinity of the protrusion electrode can be prevented, and at the same time the height of the protrusion electrode at such a position can be similar to that of the protrusion electrode on the narrow conductive wiring, thus achieving the stable connection.

In the above-stated wiring board, polyimide generally is used as the film base 4. If necessary, an insulating film material such as PET or PEI may be used. As the conductive wirings, copper may be used usually, which may be formed at a thickness from 3 to 20 μm. If necessary, an epoxy-based adhesive may be intervened between the film base and the conductive wirings.

The protrusion electrode 7 is formed so as to extend across a predetermined portion of the conductive wiring 5. That is to say, as shown in FIG. 1A, the protrusion electrode 7 is formed so as to traverse the conductive wiring 5 in the width direction from one side of the conductive wiring to the other side. The traversing direction is the direction perpendicular to the longitudinal direction (length direction) of the conductive wiring 5, and this direction is preferable. As described above, there are conductive wirings 5 susceptible to the influences of a stress due to a load and an amplitude of ultrasonic waves applied when a semiconductor element is mounted, which may be located at both ends in the longitudinal direction of a semiconductor element, at short sides thereof and located isolation, the widths of the conductive wirings 5 at those positions may be widened so as to enhance their strength. The cross section of the protrusion electrode 7 in the length direction of the conductive wiring 5 may be substantially rectangular as shown in FIG. 1B. The cross section of the protrusion electrode 7 in the width direction of the conductive wiring 5 may be substantially in a reversed U-liked shape bonded to the top face and both side faces of the conductive wiring 5 and in a convex shape with a center portion higher than both end portions as shown in FIG. 1C. The thickness of the protrusion electrode 7 may be greater in the upper portion of the top face of the conductive wiring 5 than the thickness of the portion in the horizontal direction on the side faces of the conductive wiring 5. The protrusion electrode 7 may contact with the surface of the film base at both sides of the conductive wiring 5.

Since the protrusion electrode 7 is formed in the above-stated shape, such a protrusion electrode 7 can be supported on the conductive wiring 5 with a practically sufficient strength. Firstly, since the protrusion electrode 7 is bonded not only at the top face of the conductive wiring 5 but also at the both side faces of the conductive wiring 5, it therefore has sufficient stability against a force applied in the horizontal direction.

Furthermore, since the protrusion electrode 7 has not a flat shape but a convex shape at the top face, it can be connected with an electrode pad 6 of the semiconductor element 2 appropriately. Firstly, even when there is misalignment between the protrusion electrode 7 and the electrode pad 6, the protrusion electrode 7 is unlikely to be connected with an adjacent inappropriate electrode pad 6 as compared with the case of the flat face. Secondly, when the protrusion electrode 7 is connected with the electrode pad 6, the convex-shaped top face of the protrusion electrode 7 functions to cause a clean surface to be exposed at the surface of the electrode pad 6, thus obtaining favorable electrical connection. Thirdly, when the protrusion electrode 7 and the electrode pad 6 are connected each other with a resin layer intervening between the semiconductor element 2 and the tape carrier substrate 1, the convex-shaped top face of the protrusion electrode 7 can remove the resin layer easily.

Incidentally, in order to obtain the above-stated effects, it is not necessarily required to form the protrusion electrode 7 so as to contact with the surface of the film base 4 at both sides of the conductive wiring 5 as described above. Such a configuration, however, allows the protrusion electrode 7 to be supported by the conductive wiring 5 most stably against a force applied in the horizontal direction. Furthermore, it is not necessarily required that the cross section of the protrusion electrode 7 in the length direction of the conductive wiring 5 is substantially rectangular. Such a configuration, however, enables the most favorable connection capability with the electrode pad 6 of the semiconductor element 2, and also facilitates the manufacturing. Moreover, it is not necessarily required to make the upper portion of the protrusion electrode 7 on the top face of the conductive wiring 5 thicker than the thickness in the horizontal direction of the portion on the side faces of the conductive wiring 5. Such a configuration, however, is effective for suppressing a short circuit between the conductive wiring 5 and the semiconductor element 2 resulting from a warpage of the tape carrier substrate 1 or the like and for avoiding a short circuit with the protrusion electrode 7 on an adjacent conductive wiring 5. This shape can be formed by a manufacturing process using plating. When copper is used as the protrusion electrodes 7, it is desirable that metal plating, e.g., plating of a soft metal, such as gold plating, be conducted for the protrusion electrodes 7 and the conductive wirings 5.

The following describes a method for mounting the semiconductor element 2 on the above-stated tape carrier substrate 1 to manufacture a semiconductor device.

Figure 9A:
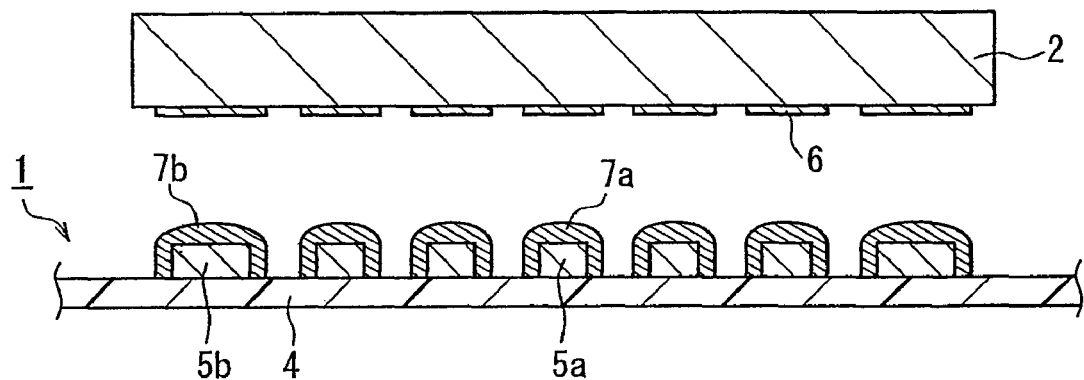
FIGS. 9A to 9B are cross-sectional views showing a process for mounting a semiconductor element on the tape carrier substrate to manufacture a semiconductor device.
Figure 9B:
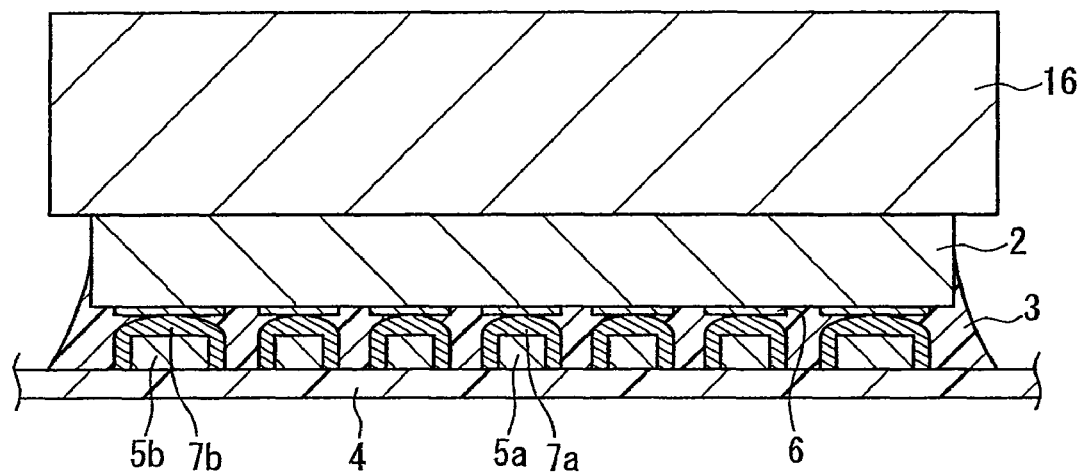

According to the first method, as shown in FIG. 9A, the tape carrier substrate 1 and the semiconductor element 2 firstly are aligned and opposed to each other. Next, as shown in FIG. 9B, pressure is applied using a bonding tool 16 so that the tape carrier substrate 1 and the semiconductor element 2 push each other until protrusion electrodes 7a and 7b are brought into contact with electrode pads 6. In this state, ultrasonic waves are applied to the contacting portions via the bonding tool 16, whereby the protrusion electrodes 7a and 7b are bonded to the electrode pads 6. At this time, although a stress is applied to a portion of the conductive wiring 5b close to the protrusion electrode 7b aligned on the film base 4, a break of the conductive wiring can be prevented because the conductive wirings located at both ends in the longitudinal direction of the semiconductor element, at short sides and located in isolation are widened. In addition, the protrusion electrodes 7a and 7b have a uniform height, thus achieving the connection stability.

Then, after bonding, as shown in FIG. 9B, a gap between the tape carrier substrate 1 and the semiconductor element 2 is filled with an encapsulation resin 3. Since the protrusion electrodes 7a and 7b and the electrode pads 6 vibrate while the tips of the convex-shaped protrusion electrodes 7a and 7b are in contact with the surface of the electrode pads 6, the remarkable effect of exposing a new-formed surface on the electrode pads 6 can be obtained, thus achieving favorable bonding.

Figure 10:
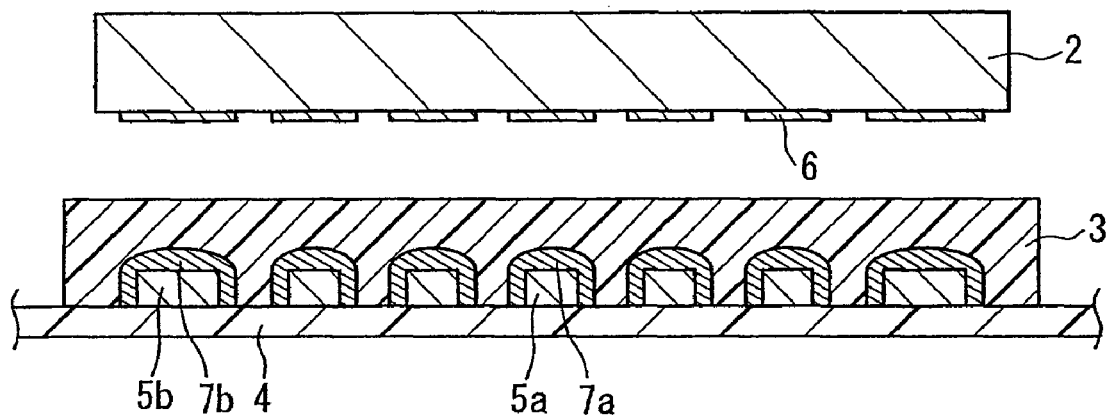
FIG. 10 is a cross-sectional view showing another process for mounting a semiconductor element on the tape carrier substrate to manufacture a semiconductor device.
Figure 11:
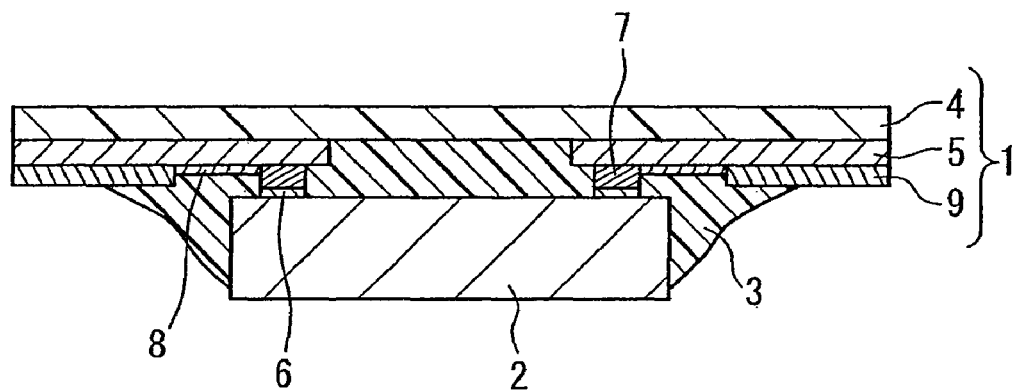
FIG. 11 is a cross-sectional view showing an exemplary conventional semiconductor device.
Figure 12A:
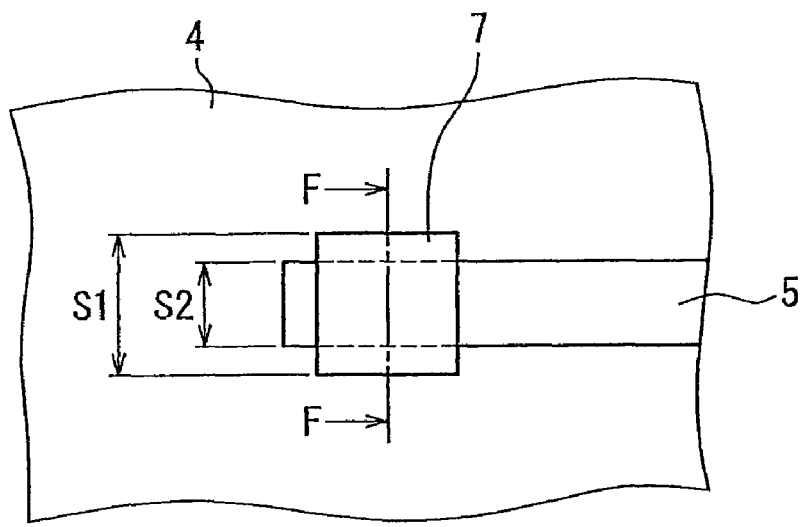
FIG. 12A is a partial plan view of an exemplary conventional tape carrier substrate.
Figure 12B:
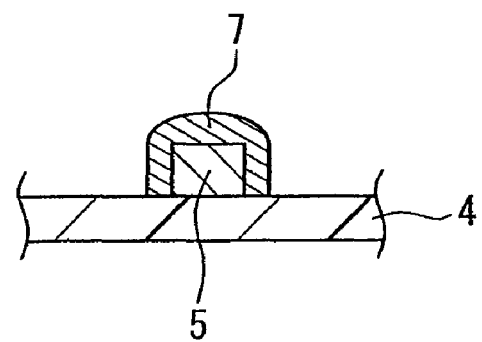
FIG. 12B is a cross-sectional view taken along with the line F-F of FIG. 12A.
Figure 13A:
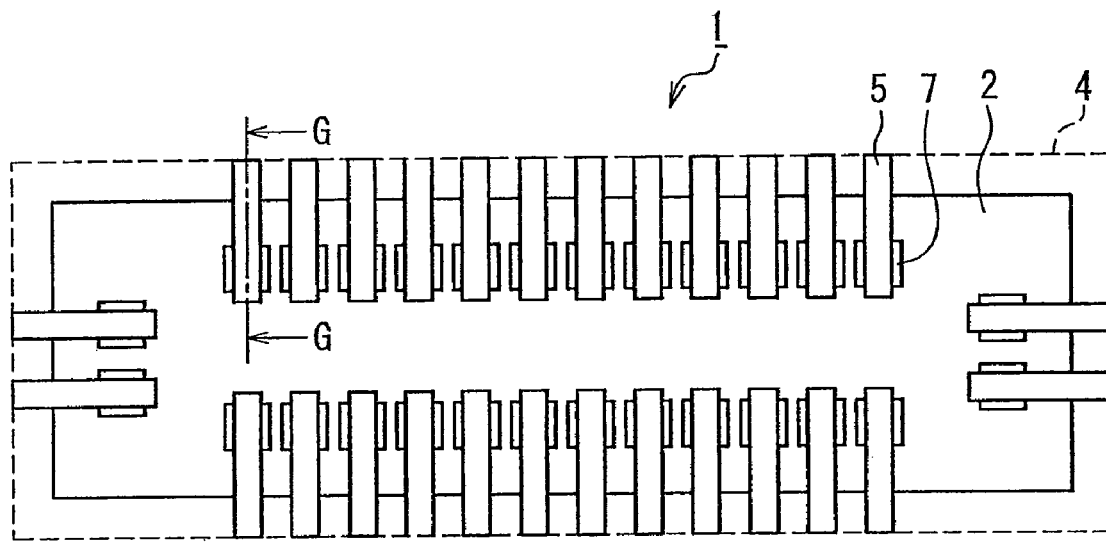
FIG. 13A is a plan view for explaining a break occurring at a connection portion between a protrusion electrode of an exemplary conventional tape carrier substrate and an electrode pad of a semiconductor element.
Figure 13B:
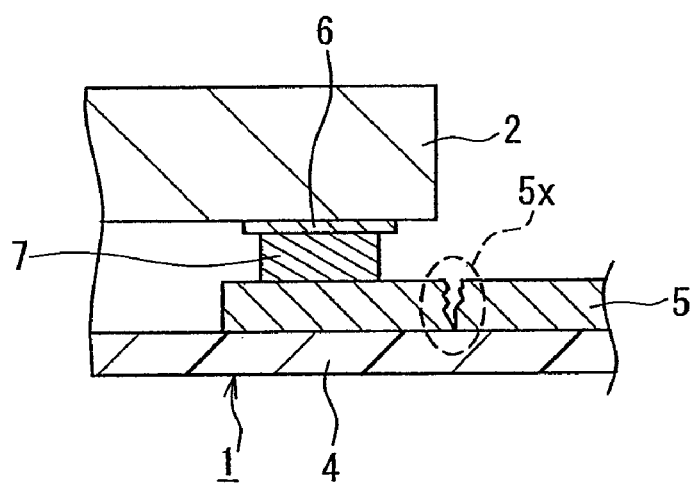
FIG. 13B is a cross-sectional view taken along the line G-G of FIG. 13A.

According to the second method, as shown in FIG. 10, an encapsulation resin 3 is applied over the region where protrusion electrodes 7a and 7b of the tape carrier substrate 1 are formed, and thereafter the tape carrier substrate 1 and the semiconductor element 2 are aligned and opposed to each other. Next, as shown in FIG. 9B, a pressure is applied using a bonding tool 16 so that the tape carrier substrate 1 and the semiconductor element 2 push each other until the protrusion electrodes 7a and 7b are brought into contact with electrode pads 6. In this state, ultrasonic waves are applied to the contacting portions via the bonding tool 16, whereby the protrusion electrodes 7a and 7b are bonded to the electrode pads 6. Concurrently with the bonding, the encapsulation resin 3 is cured provisionally. At this time, since the protrusion electrodes 7a and 7b have a convex shape with a center portion higher than both end portions, the encapsulation resin 3 can be pushed away at the both sides of the protrusion electrodes 7a and 7b effectively, thus facilitating the contact between the protrusion electrodes 7a and 7b and the electrode pads 6. Also in the second method, since the protrusion electrodes 7a and 7b and the electrode pads 6 vibrate while the tips of the convex-shaped protrusion electrodes 7a and 7b are in contact with the surface of the electrode pads 6, the remarkable effect of exposing a new-formed surface on the electrode pads 6 can be obtained, thus achieving favorable bonding.

During these manufacturing processes, although a stress is applied to a portion of the conductive wirings close to the protrusion electrodes aligned on the film base 4, a break of the conductive wirings 5 can be prevented because the conductive wirings 5 located at both ends in the longitudinal direction of the semiconductor element, at short sides and located in isolation are widened. Furthermore, the protrusion electrodes 7 have a uniform height, thus achieving the connection stability.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wiring board, comprising:

a film base;

a plurality of conductive wirings aligned on the film base; and protrusion electrodes formed of a plated metal at end portions of the conductive wirings, respectively, wherein an outer surface at both side portions of the protrusion electrodes in cross section in a width direction of the conductive wirings defines a curve, and the protrusion electrodes in cross section in a longitudinal direction of the conductive wirings define a rectangular shape, the conductive wirings comprise a first conductive wiring having a wiring width of W1 and a second conductive wiring having a wiring width of W2 larger than W1, the protrusion electrodes comprise a first protrusion electrode formed on the first conductive wiring and having a width of W3 and a second protrusion electrode formed on the second conductive wiring and having a width of W4 larger than W3, the first protrusion electrode and the second protrusion electrode are substantially the same height, and a part of side surfaces of the conductive wirings is covered with the protrusion electrodes.

2. The wiring board according to claim 1,
wherein the first and second protrusion electrodes are formed by metal plating, and
assuming that during a process of forming the first and second protrusion electrodes by the metal plating, a maximum of heights of the first and second protrusion electrodes that change in accordance with a change in widths of the first and second conductive wirings is hB, a height of the first protrusion electrode formed on the first conductive wiring is h1 and a height of the second protrusion electrode formed on the second conductive wiring is h2, the wiring width W1 and the wiring width W2 are set so that a difference between the heights of the first and second protrusion electrodes establishes the following relationships:

$|h1-h2|<(hB-h1)$ and $|h1-h2|<(hB-h2)$.

3. The wiring board according to claim 1, wherein the second conductive wiring is disposed at least one of an end position of a line of the first conductive wirings and an isolated position.

4. The wiring board according to claim 1, wherein a curvature radius of an outer surface at both side portions of the protrusion electrodes in cross section in the width direction of the conductive wirings is larger in the second protrusion electrode on the second conductive wiring than in the first protrusion electrode on the first conductive wiring.

5. A semiconductor device, comprising:
a wiring board comprising a film base; a plurality of conductive wirings aligned on the film base; and protrusion electrodes formed of a plated metal at end portions of the conductive wirings, respectively, wherein an outer surface at both side portions of the protrusion electrodes in cross section in a width direction of the conductive wirings defines a curve, and the protrusion electrodes in cross section in a longitudinal direction of the conductive wirings define a rectangular shape, the conductive wirings comprise a first conductive wiring having a wiring width of W1 and a second conductive wiring having a wiring width of W2 larger than W1, and the protrusion electrodes comprise a first protrusion electrode formed on the first conductive wiring and having a width of W3 and a second protrusion electrode formed on the second conductive wiring and having a width W4 larger than W3, the first protrusion electrode and the second protrusion electrode are substantially the same height; and
a semiconductor element mounted on the wiring board, wherein electrode pads of the semiconductor element are directly connected to the protrusion electrodes.

6. A method for manufacturing a semiconductor device, comprising the steps of:
using a wiring board comprising a film base;
a plurality of conductive wirings aligned on the film base; and
protrusion electrodes formed of a plated metal at end portions of the conductive wirings, respectively, wherein an outer surface at both side portions of the protrusion electrodes in cross section in a width direction of the conductive wirings defines a curve, and the protrusion electrodes in cross section in a longitudinal direction of the conductive wirings define a rectangular shape, the conductive wirings comprise a first conductive wiring having a wiring width of W1 and a second conductive wiring having a wiring width of W2 larger than W1, and the protrusion electrodes comprise a first protrusion electrode formed on the first conductive wiring and having a width of W3 and a second protrusion electrode formed on the second conductive wiring and having a width W4 larger than W3, the first protrusion electrode and the second protrusion electrode have a substantially same height, and a part of side surfaces of the conductive wirings is covered with the protrusion electrodes;
forming an encapsulation resin over a region where the protrusion electrodes are formed on the conductive wirings;
then disposing a semiconductor element above the wiring board so that electrode pads of the semiconductor element are opposed to the protrusion electrodes; and
connecting the electrode pads of the semiconductor element with the conductive wirings via bonding with the protrusion electrodes.

7. The method for manufacturing a semiconductor device according to claim 6, wherein when the electrode pads of the semiconductor element are connected with the protrusion electrodes, while the electrodes pads and the protrusion electrodes are brought into contact with each other and a pressure is applied thereto, ultrasonic waves are applied to a portion of the contact.

8. A semiconductor device according to claim 5, wherein a part of side surfaces of the conductive wirings is covered with the protrusion electrodes.

* * * * *